United States Patent [19]

Pierce et al.

[11] 4,058,890

[45] Nov. 22, 1977

[54] METHOD FOR MOUNTING PRINTED CIRCUIT BOARDS

[75] Inventors: Perry H. Pierce; Dan L. Prendergast, both of Loveland, Colo.

[73] Assignee: Hewlett-Packard Company, Palo Alto, Calif.

[21] Appl. No.: 622,792

[22] Filed: Oct. 15, 1975

[51] Int. Cl.² .............................................. H05K 3/36
[52] U.S. Cl. ...................................... 29/625; 16/171; 174/68.5; 361/412
[58] Field of Search ..................... 29/625, 626, 627; 317/101 B, 101 CM, 101 D, 101 DH, 101 F; 174/68.5; 16/171; 339/4, 17 M

[56] References Cited

U.S. PATENT DOCUMENTS

| 2,740,097 | 3/1956 | Edelman et al. ................... 339/4 X |
| 3,014,161 | 12/1961 | Tarczy-Hornoch ......... 317/101 DH |
| 3,147,402 | 9/1964 | Hochstetler ............... 317/101 DH X |
| 3,199,059 | 8/1965 | Masse et al. ............................ 339/4 |
| 3,356,905 | 12/1967 | Linn .................................... 339/4 X |
| 3,382,414 | 5/1968 | Borner ................................. 339/4 X |
| 3,662,225 | 5/1972 | Carter et al. ......................... 317/118 |

FOREIGN PATENT DOCUMENTS

| 2,030,906 | 12/1970 | Germany ..................... 317/101 DH |
| 1,277,348 | 6/1972 | United Kingdom ......... 317/101 DH |

*Primary Examiner*—Victor A. DiPalma
*Attorney, Agent, or Firm*—David A. Boone

[57] ABSTRACT

Interlocking hinges are attached to printed circuit boards and coupled together to form a stack of printed circuit boards. Access to each board is possible by rotating the stack at a selected hinge to expose a selected board. A projection and an opening on each hinge mate with openings and projections on other hinges to allow easy removal or addition of a board from the stack when the hinges are in one relative position, but to create an interference fit in a second relative position, thereby causing the hinges to lock together and form a rigid structure.

4 Claims, 9 Drawing Figures

METHOD FOR MOUNTING PRINTED CIRCUIT BOARDS

BACKGROUND & SUMMARY OF THE INVENTION

Printed circuit boards are widely used to contain the electronic circuits of various products. Access to the components of these circuits for testing and repair while the printed circuit boards are installed in the product has presented a problem. Although it is possible to use automatic testing fixtures to analyze boards while they are not in the instrument, some problems are most easily ascertained while the board is in position in the product and in its normal operating mode. Also, when the unit malfunctions at a customer's site, service personnel cannot always rely on testing equipment as sophisticated as that available at manufacturing facilities.

Some previous printed circuit board mounting methods have employed rigid structures which provided limited access. They required the use of extender boards and extension cables to provide access to components on a selected board. These techniques frequently distort or interfere with the operation of the board which has been extended from its normal position.

Hinged stand-offs have been used to mount printed circuit boards to each other or a supporting structure. This type of system had the disadvantage that misalignment of the hinged stand-offs coupling a board to a supporting structure interfered with the proper operation of the hinges. Also, the removal of a board from a structure employing hinged stand-offs requires removing hardware coupling the board to be removed from other boards or the supporting structure above and below it.

According to the preferred embodiment of the present invention, interlocking hinges become an integral piece of the printed circuit board. These hinges then mate to form one contiguous structure. The one-piece hinges minimize fabrication and assembly costs since they can be plastic molded and do not require additional hardware.

The interlocking feature is provided by a projection and an opening on each hinge. In one position the projection on one hinge fits freely into the opening of a second hinge. In this position, it is easy to add additional boards to the stack or remove a particular board from the stack. But, when the hinges are rotated to the in-line position, a cam on the projection forms an interference fit with the opening and provides a rigid structure. Flexible cable is used to electrically couple the printed circuit boards.

DESCRIPTION OF THE PREFERRED EMBODIMENT

Figure 1:
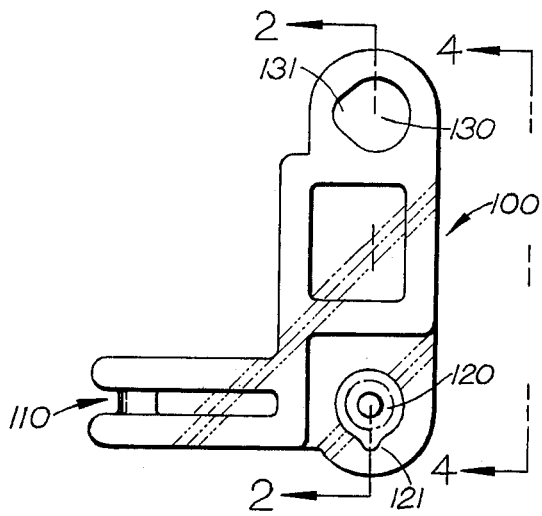
FIG. 1 is a side view of the interlocking hinge of the preferred embodiment.
Figure 2:
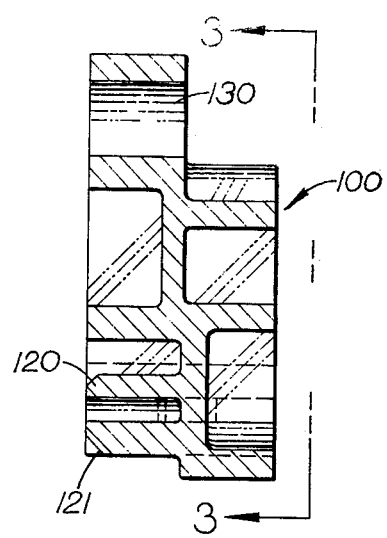
FIG. 2 is a sectional view, along the line 2-2 shown in FIG. 1, of the interlocking hinge of the preferred embodiment.
Figure 3:
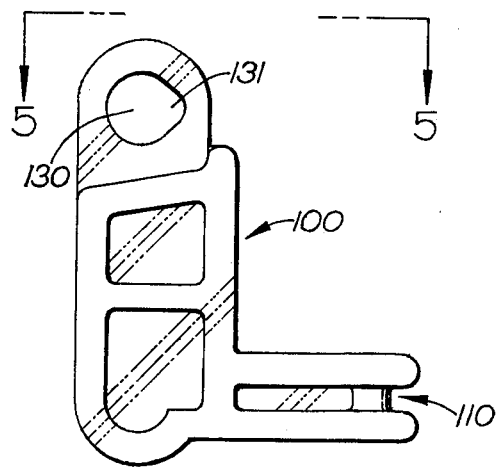
FIG. 3 is a view of the side opposite the side of the interlocking hinge of the preferred embodiment which is shown in FIG. 1; the direction of this view is also indicated by the line 3—3 in FIG. 2.
Figure 4:
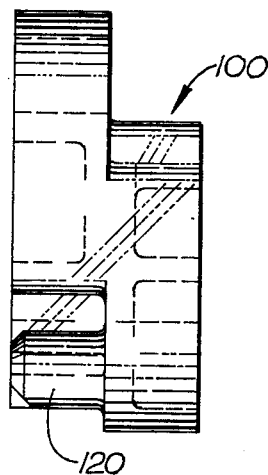
FIG. 4 is a back view from the direction indicated by line 4—4 in FIG. 1 of the interlocking hinge of the preferred embodiment.
Figure 5:
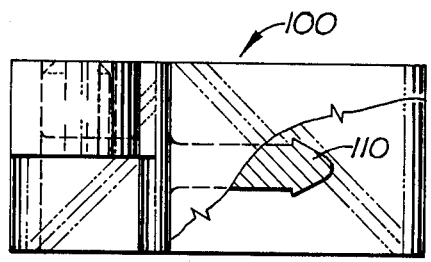
FIG. 5 is a top view, from the direction indicated by line 5—5 in FIG. 3, of the interlocking hinge of the preferred embodiment.

In FIGS. 1, 2, 3, 4, and 5 various views of an interlocking hinge 100 which is used in the preferred embodiment are shown. The interlocking hinge 100 is designed to mate with other interlocking hinges to form a support structure for a plurality of printed circuit boards. The hinges are joined by inserting a projection 120 of a first hinge into an opening 130 of a second hinge. The two hinges selected are most easily joined when the lobe-shaped portion 121 of projection 120 is aligned with a larger radius portion 131 of opening 130. Once the two selected hinges are fitted together, one of the hinges is rotated about the axis defined by the mated projection and opening. The lobe-shaped portion 121 of the projection is forced into the smaller radius portion of the opening 130. An interference fit which results from this rotation causes the two hinges to form a rigid structure.

Figure 6:
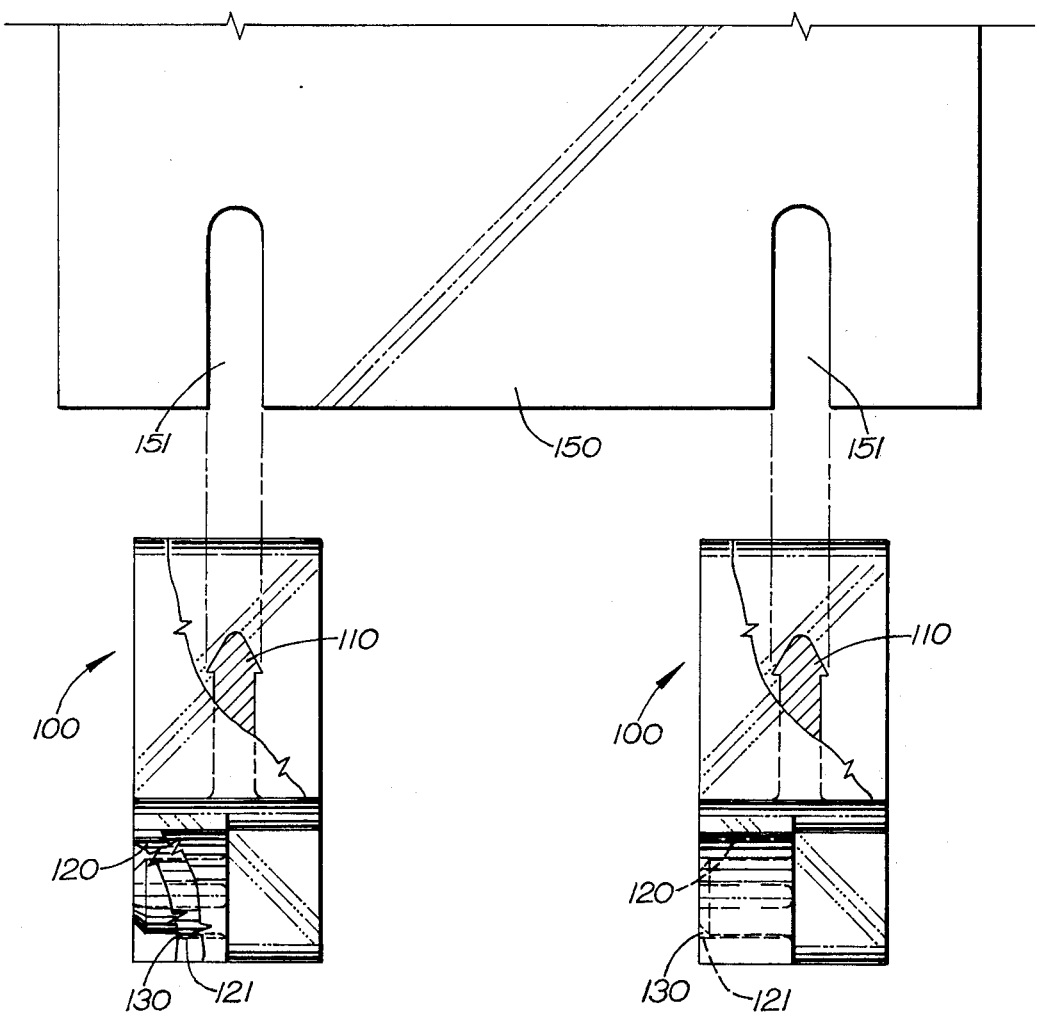
FIG. 6 shows a top view of a printed circuit board and two hinges for attaching thereon in accordance with the preferred embodiment.

In FIG. 6 there is shown the manner in which the interlocking hinges are attached to printed circuit boards. For stability, two hinges are usually attached to each printed circuit board. The attachment is effected by force-fitting an arrow-shaped portion 110 of hinge 120 into a slot 151 in printed circuit board 150. Once hinges 100 are attached to printed circuit board 150 they remain an integral part of that assembly. When a board is removed from the stack of printed circuit boards to be replaced by another board, the replacement board should have its own set of hinges attached.

Figure 9:
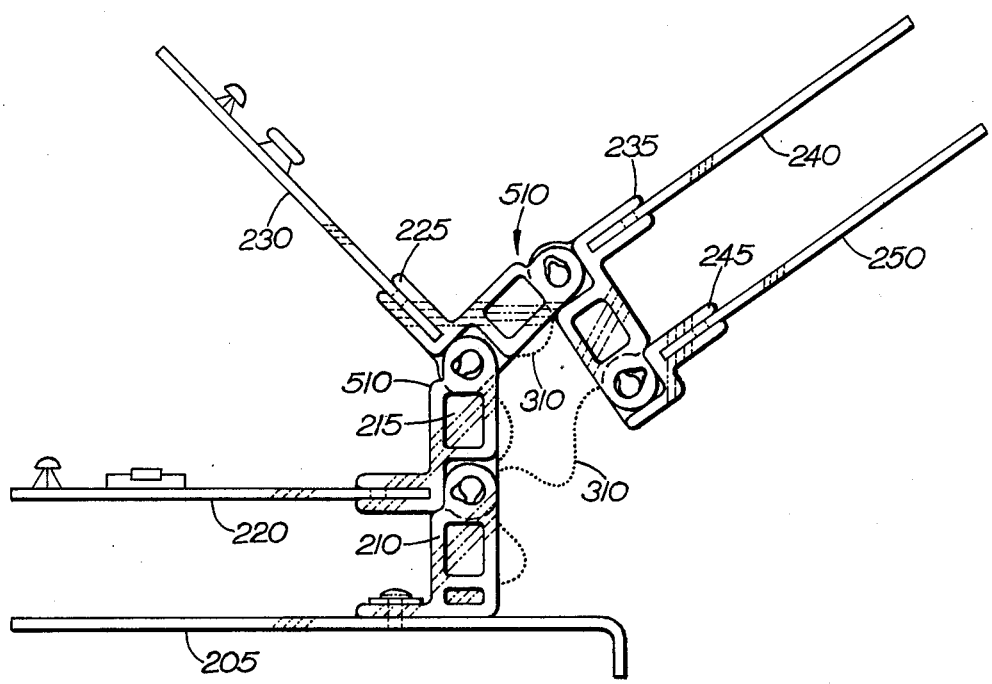
FIG. 9 shows a side view of a stack of printed circuit boards in accordance with the preferred embodiment a stack of printed circuit boards being defined as at least two printed circuits boards which are coupled together and which may be positioned one above the other.

In FIG. 9, a base-hinge 210 is shown. Base-hinge 210 is affixed to deck 205 and provides a base for hinges 215, 225, 235 and 245 which are attached to the printed circuit boards. Hinge 245 is also a modified hinge; additional boards cannot be mounted above it. Hinge 245 is attached to the top printed circuit board of the stack to reduce the total height of the stack. Note that a stop 510 is provided on each of the interlocking hinges to ease alignment of the hinges and ensure all boards are parallel when the hinges are rotated to the locked position.

In FIG. 9, a stack of printed circuit boards has been adjusted to provide access to components on boards 220 and 230. By using a flexible cable 310 to couple printed circuit boards 220, 230, 240, and 250, the stack may be rotated to provide access to components on any of the printed circuit boards without disturbing their operational state. Once a defective component has been isolated, the board containing it may be removed for repair or replacement.

Figure 7:
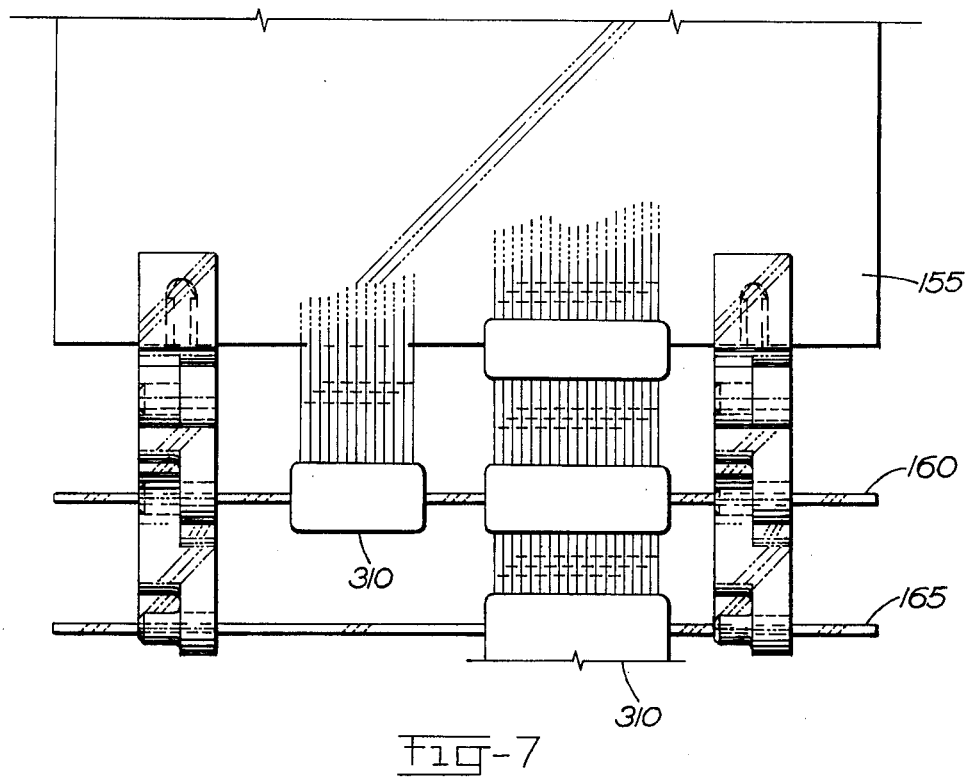
FIG. 7 shows a rear view of a stack of printed circuit boards coupled in accordance with the preferred embodiment.
Figure 8:
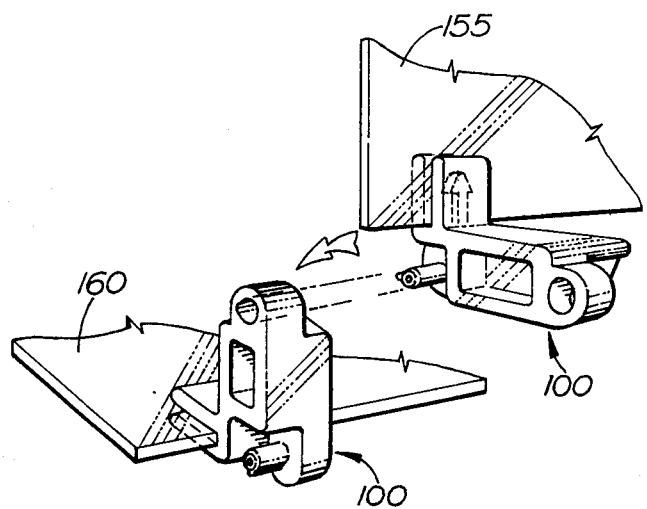
FIG. 8 is a perspective view of two hinges in the relative position for engagement and disengagement.

The procedure to remove a selected printed circuit board from the stack is illustrated in FIGS. 7 and 8. In the preferred embodiment, flexible cable 310 couples printed circuit boards 155, 160, and 165. After cable 310 is removed, the printed circuit board selected for removal from the stack is rotated to a relative position with respect to the adjacent board which aligns the projection and the opening in the hinges coupling the two boards. The board is then moved sidewards to disengage the projection and opening. A replacement board is installed by aligning the hinge of the replacement board with the hinge of the adjacent board, mating the cam on the projection of the one hinge with the opening of the other hinge, as shown in FIG. 8, and rotating the replacement board so that the above-explained interference fit occurs and locks the two boards together. Any cabling removed may then be replaced.

Additional features may be included to provide a greater degree of freedom from shock and vibration. For example, various features may include stand-offs or spacers to provide additional support and provide a more rigid structure. The choice of these various additional support systems is not part of the present invention.

We claim:

1. A method of mounting a plurality of printed circuit boards, the method comprising the steps of:

providing at least one slot in each of said printed circuit boards;

providing hinges having two lateral extensions which are essentially parallel planar structures having force-fitting means therebetween, said force-fitting means comprising an essentially arrow-shaped structure for force-fitting into said slot in one of said printed circuit boards;

attaching said hinges to said plurality of printed circuit boards; and interlocking the hinges together to form a stack of printed circuit boards.

2. The method of claim 1 wherein the step of interlocking the hinges includes the steps of positioning a projection from one hinge into an opening having a similar shape and rotating the hinges to form an interference fit between the projection and the opening.

3. The method as in claim 2, further comprising the step of installing a flexible cable assembly coupling the plurality of printed circuit boards.

4. The method as in claim 3 further comprising the steps of:

connecting one or more interlocking hinges to a support structure; and interlocking the hinges attached to the printed circuit boards with the hinges connected to the support structure.

* * * * *